(12) United States Patent
Liang et al.

(10) Patent No.: US 8,514,564 B2
(45) Date of Patent: Aug. 20, 2013

(54) DISK ON MODULE DEVICE

(75) Inventors: An-Gang Liang, Shenzhen (CN);
Ping-Chuan Deng, Shenzhen (CN);
Ming-Yu Liu, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 96 days.

(21) Appl. No.: 13/340,630

(22) Filed: Dec. 29, 2011

(65) Prior Publication Data

US 2013/0148285 A1 Jun. 13, 2013

(30) Foreign Application Priority Data

Dec. 8, 2011 (CN) .......................... 2011 1 0405744

(51) Int. Cl.
*G06F 1/16* (2006.01)

(52) U.S. Cl.
USPC ....... 361/679.31; 709/246; 345/667; 455/557

(58) Field of Classification Search
USPC ................ 709/217, 223, 246, 218; 345/427, 345/175, 419, 629, 420, 157, 173, 545, 667; 455/434, 404.1, 414.1, 557; 361/679.33, 361/679.32, 679.5, 679.34, 679.31, 679.37, 361/679.43, 679.48, 679.39, 679.46; 248/298.1, 248/229.1, 49, 205.1, 291.1, 306, 544, 27.5; 312/215, 223.2, 236, 333, 332.1, 311, 217, 312/245; 165/201

See application file for complete search history.

(56) References Cited

U.S. PATENT DOCUMENTS

| 2012/0007823 A1* | 1/2012 | Ozawa et al. | 345/173 |
| 2012/0256949 A1* | 10/2012 | Treat et al. | 345/629 |
| 2013/0051736 A1* | 2/2013 | Chang | 385/92 |

* cited by examiner

*Primary Examiner* — Hung Duong
(74) *Attorney, Agent, or Firm* — Altis Law Group, Inc.

(57) ABSTRACT

A disk on module device includes a serial advanced technology attachment (SATA) connector connected to a SATA interface of a motherboard, a universal serial bus (USB) connector connected to a USB interface of the motherboard, a power unit, a control chip, and a number of storage chips. The power unit is connected to a power pin of the USB connector, to receive electrical power from the motherboard through the USB connector and converts the received voltage to make it suitable for the control chip and the storage chips. The control chip is connected to the SATA connector and the storage chips, to receive a control signal from the motherboard through the SATA connector and control the storage chips to store data.

3 Claims, 3 Drawing Sheets

DISK ON MODULE DEVICE

BACKGROUND

1. Technical Field

The present disclosure relates to disks, and particularly to a disk on module (DOM) device with a serial advanced technology attachment (SATA) connector.

2. Description of Related Art

A DOM device or unit with a SATA connector for insertion into a motherboard for adding storage capacity is called a SATA DOM. The SATA DOM receives a SATA signal from the motherboard through the SATA connector and receives a voltage from a power supply through an independent power wire, however, the power supply unit may have a limited number of power connectors or no available power connectors. Therefore there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the drawings, is illustrated by way of example and not by way of limitation. References to "an" or "one" embodiment in this disclosure are not necessarily to the same embodiment, and such references mean at least one.

Figure 1:
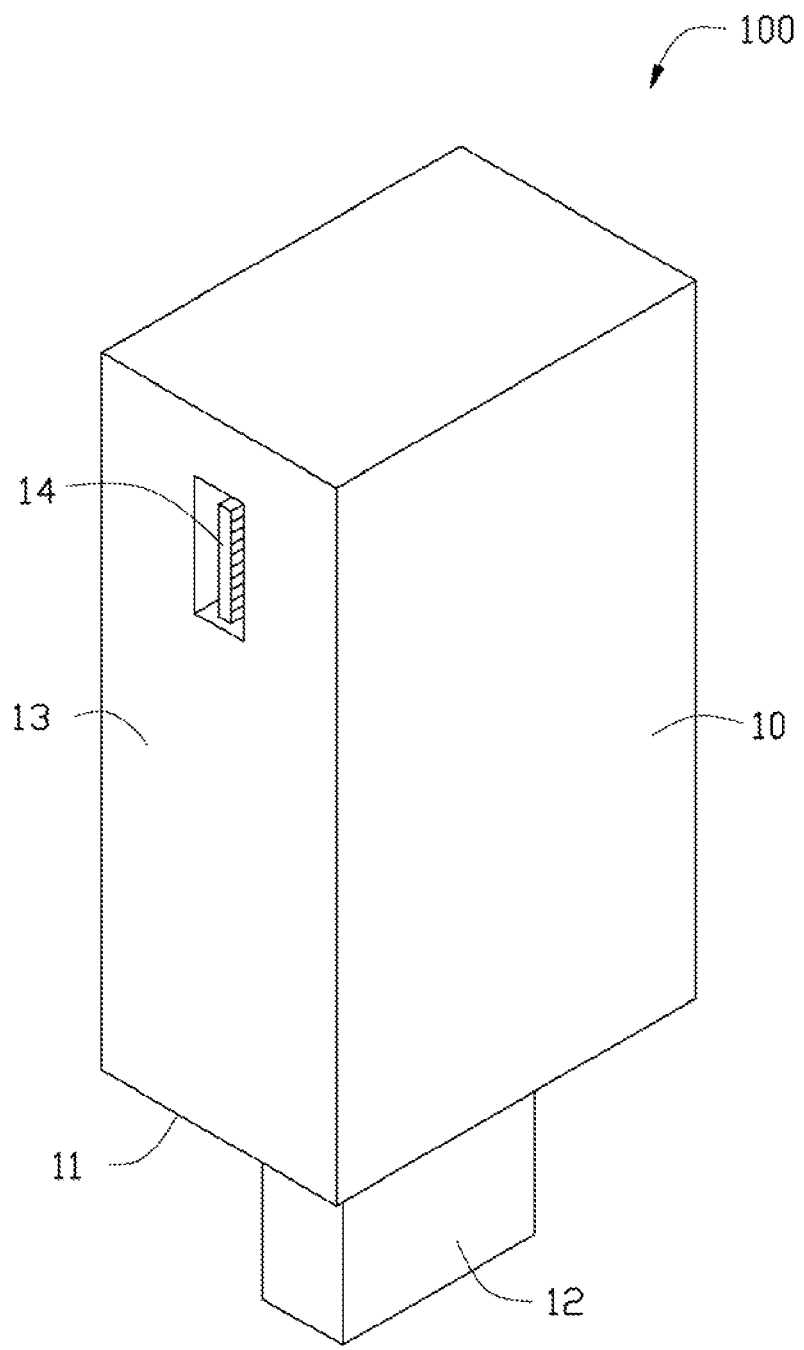
FIG. 1 is a schematic view of a disk on module device in accordance with an exemplary embodiment of the present disclosure.
Figure 2:
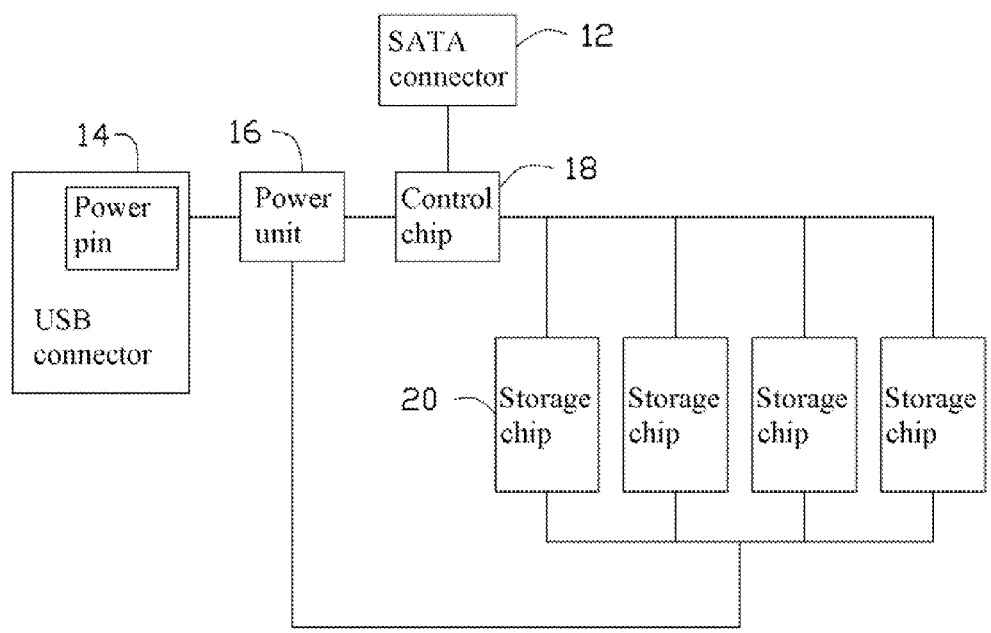
FIG. 2 is a block diagram of the disk on module device of FIG. 1.

Referring to FIGS. 1 and 2, a disk on module (DOM) device 100 in accordance with an exemplary embodiment includes a substantially rectangular main body 10, a serial advanced technology attachment (SATA) connector 12 arranged on an end surface 11 of the main body 10, a universal serial bus (USB) connector 14 arranged on a side surface 13 of the main body 10, and a power unit 16, a control chip 18, and a plurality of storage chips 20 all arranged inside the main body 10.

The power unit 16 is connected to a power pin of the USB connector 14, to receive a voltage from a motherboard 200 (shown in FIG. 3) through the USB connector 14 and to convert the received voltage. The power unit 16 is also connected to the control chip 18 and the storage chips 20, to output the voltage after conversion to the control chip 18 and the storage chips 20. The control chip 18 is connected to the SATA connector 12 and the storage chips 20, to receive a control signal, such as a SATA signal, from the motherboard 200 through the SATA connector 12 and to control the storage chips 20 to store data in accordance with the received control signal. In other embodiments, the SATA connector 12 and the USB connector 14 may be arranged on other locations of the main body 10.

Figure 3:
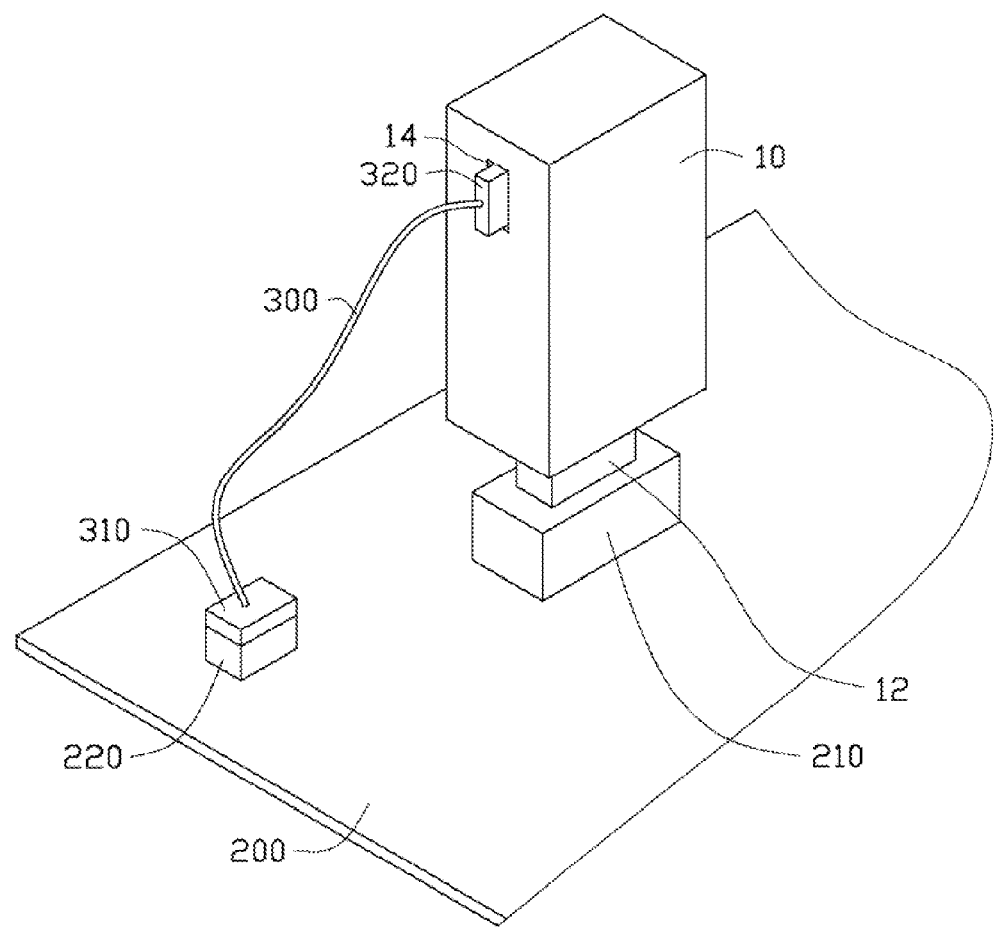
FIG. 3 is a schematic view of the disk on module device of FIG. 1 as connected to a motherboard.

Referring to FIG. 3, in use, the DOM device 100 can be inserted into any SATA interface 210 of the motherboard 200 through the SATA connector 12. The USB connector 14 is connected to any USB interface 220 of the motherboard 200 by means of a USB cable 300 with two USB connectors 310 and 320. When the motherboard 200 is powered, the power unit 16 receives power through the USB interface 220, the USB cable 300, and the USB connector 14. The power unit 16 converts the received voltage and outputs a converted voltage to the control chip 18 and the storage chips 20. At the same time, the motherboard 200 outputs a SATA signal to the control chip 18 through the SATA interface 210 and the SATA connector 12. The control chip 18 receives the SATA signal and controls the storage chips 20 to store data according to the received SATA signal.

The DOM device 100 can receive a voltage from the motherboard 200 through the USB connector 14 and the USB cable 300, so avoiding the need for an independent power supply through a power wire.

Even though numerous characteristics and advantages of the disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A disk on module (DOM) device, comprising:
a main body;
a serial advanced technology attachment (SATA) connector arranged on the main body to be connected to a SATA interface of a motherboard;
a universal serial bus (USB) connector arranged on the main body to be connected to a USB interface of the motherboard;
a power unit arranged inside the main body and connected to a power pin of the USB connector, to receive a voltage from the motherboard through the USB connector and convert the received voltage;
a plurality of storage chips arranged inside the main body and connected to the power unit, to receive the converted voltage from the power unit; and
a control chip arranged inside the main body and connected to the power unit, to receive the converted voltage from the power unit, the control chip also connected to the SATA connector and the storage chips, to receive a control signal from the motherboard through the SATA connector and control the storage chips to store data according to the received control signal.

2. The DOM device of claim 1, wherein the USB connector is operable to be connected to the USB interface of the motherboard by a cable with two USB connectors.

3. The DOM device of claim 1, wherein the main body is rectangular, the SATA connector is arranged on an end surface of the main body, the USB connector is arranged on a side surface of the main body.

* * * * *